United States Patent [19]
Main

[11] Patent Number: 5,488,576
[45] Date of Patent: Jan. 30, 1996

[54] AMPLITUDE ADAPTIVE FILTER

[75] Inventor: David R. Main, Boulder Creek, Calif.

[73] Assignee: The 3DO Company, Redwood City, Calif.

[21] Appl. No.: 199,097

[22] Filed: Feb. 22, 1994

[51] Int. Cl.⁶ ..................................................... G06F 17/10
[52] U.S. Cl. ................................. 364/724.01; 364/724.19
[58] Field of Search ........................... 364/724.01, 724.1, 364/724.13, 724.19, 724.16, 723

[56] References Cited

U.S. PATENT DOCUMENTS

| | | | |
|---|---|---|---|
| 3,895,343 | 7/1975 | Farr | 367/190 |
| 4,694,414 | 9/1987 | Christopher | 364/723 |
| 5,016,280 | 5/1991 | Engebreston et al. | 381/68 |

OTHER PUBLICATIONS

"Analog Filter Design for Video A/D and D/A Converters", Brooktree Corporation, Application Note 35 (1993).

Primary Examiner—Roy N. Envall, Jr.
Assistant Examiner—Emmanuel L. Moise
Attorney, Agent, or Firm—Fliesler, Dubb, Meyer & Lovejoy

[57] ABSTRACT

A digital filter transfer function is implemented using at least two implementing filters, one of which has a transfer function which guarantees an output which is unconditionally within a predefined output compliance range, and the other of which has a transfer function equal to the difference between the overall desired transfer function and the transfer function of the first implementing filter. Typically, the output samples produced by the two implementing filters are summed to provide an overall output sample. However, if the sum of an output sample from one of the implementing filters and the corresponding output sample from the other implementing filter falls either above or below predetermined threshold values, then the output of the first implementing filter, instead of the summed output, is provided as the sample output of the overall filter. Transient undershoots and overshoots are thus prevented, while the response of the filter is degraded only when necessary to avoid compliance range violation.

29 Claims, 11 Drawing Sheets

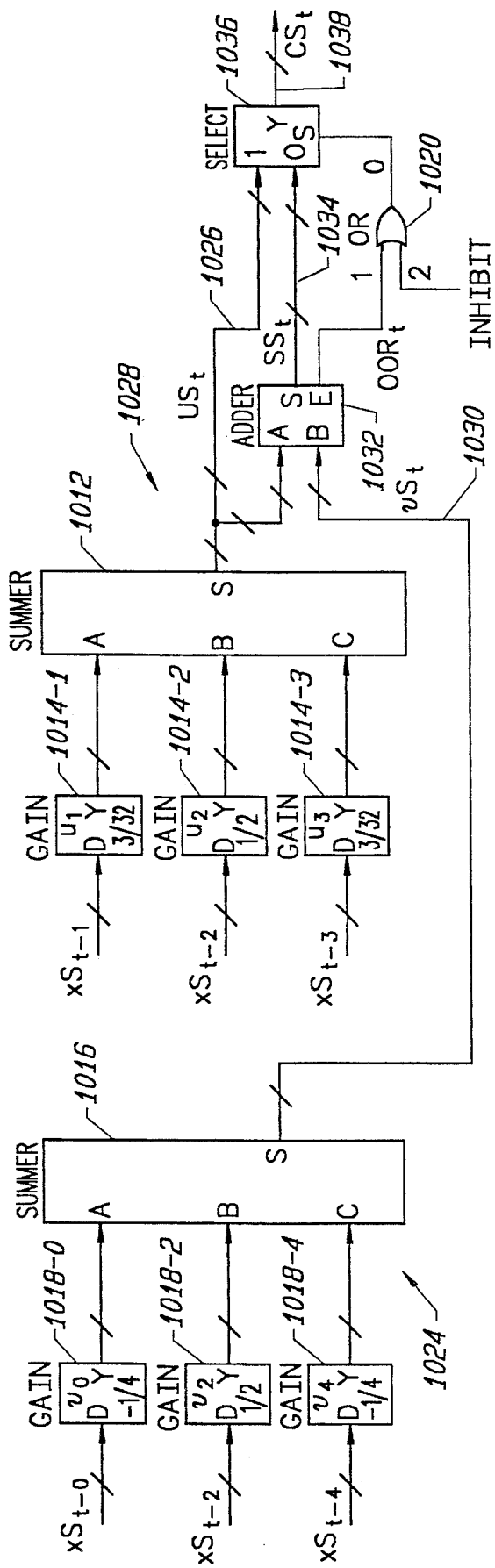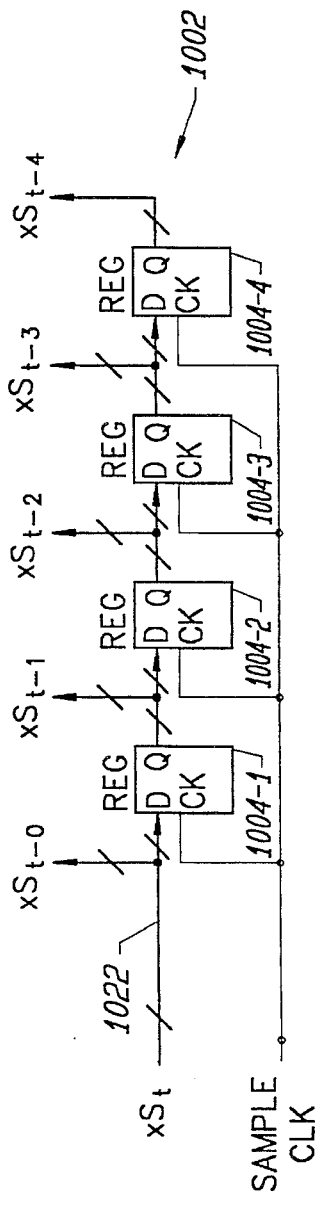
FIG. 10A
FIG. 10B

AMPLITUDE ADAPTIVE FILTER

BACKGROUND

1. Field of the Invention

The invention relates to digital filters, and more particularly, to an improved digital filter which avoids undershoot and overshoot problems.

2. Description of Related Art

It is often desirable to design digital filters whose frequency response changes sharply at a particular frequency. For example, in the design of a low-pass filter, it is often ideal for the filter to pass all frequencies below the cut-off frequency with a gain of unity, and pass all frequencies above the cut-off frequency with a gain of zero (i.e., such frequencies are suppressed completely). These filters present a number of design tradeoffs, most commonly the tradeoff between the steepness of the roll-off and the physical size of the filter. Another tradeoff which arises in the design of these filters is that the sharper the transition in the frequency domain, the more severe are the undershoot and overshoot excursions which are produced due to the Gibbs phenomenon in the time domain in response to input signal amplitude transitions. Transient undershoot and overshoot excursions often appear as "ringing" in the time domain output signal in response to an abrupt step transition from one constant level to another constant level in the time domain input signal. It is known that undershoot and overshoot excursions can be avoided by using filters having a Gaussian roll-off characteristic, but this may not satisfy the requirements for the system.

Transient undershoot/overshoot is a problem in many system designs since it may, depending on the specific input signal and the filter transfer function, result in output levels which exceed the compliance limits for which various elements of the system are designed. For such a signal to avoid distortion, subsequent elements of the system must be capable of processing and conveying data of greater magnitude than would be required if the filter did not produce transient undershoot or overshoot. Such capability frequently requires that the subsequent elements in the system be able to handle additional high-order significant bits of data. This additional requirement is over and above any increased encoding precision requirements caused by the generation of low-order bits by the filtering arithmetic processes.

Accordingly, filters which generate undershoot or overshoot usually require additional bits of data encoding precision to be carried throughout all subsequent digital signal processing elements, including any DAC which may be present to convert the output data to an analog signal. The circuitry is therefore more expensive, since each additional bit of precision requires greater arithmetic circuit complexity as well as additional pipeline register storage capacity. The additional arithmetic circuit complexity can also, in many instances, result in slower system throughput owing to the increased propagation delays inherent in more complex combinational logic.

Another problem caused by transient undershoot/overshoot characteristics of digital filters appears in a DSP system which must ultimately convert digital output data into an analog signal using a DAC. A DSP system DAC with a compliance range which is defined by the transient undershoot or overshoot limits will have a greater compliance range than will a DSP system DAC with a compliance range defined by minimum and maximum steady-state levels. Thus the precision (number of monotonic conversion bits) of such a DAC must be greater if it is to maintain the same adjacent code differential quantization as a DAC whose compliance range is defined by steady-state levels. This increases the cost and complexity of the DAC.

The need to pass undershoot and overshoot transients can also degrade the signal-to-noise ratio (SNR) performance of such a DAC. The output of a DAC will satisfy its conversion linearity error tolerance specification only if its output bias level is maintained between specified limits. This requires, for example, that the output voltage bias of a current-mode DAC always be greater than a minimum voltage and less than a maximum voltage. For low voltage (e.g. five volts or less) integrated circuits, which constitute a significant commercial technology in which DSP systems and DACs are implemented, it is desirable to provide the greatest voltage range available for internal DAC circuits while, at the same time, minimizing noise degradation of the output signal by allowing the greatest possible voltage compliance range for the output signal. When transient excursions must be passed, there is less voltage range available for the internal circuitry of the DAC and for the output analog signal during steady-state operation. This necessitates the attenuation of the output signal range for steady-state operation since the operation of the internal circuitry must be ensured. That is, if the output signal range is not attenuated, then a transient undershoot or overshoot in the digital input signal to the DAC might create non-linearities, oscillations, latch-up or other problems in the internal circuitry of the DAC. However, since additive noise typically has a constant amplitude, the result of such attenuation is a degraded signal-to-noise ratio.

Still another problem caused by undershoot/overshoot excursions is apparent in DSP systems producing signals which are intended to adhere to a standard specification such as the NTSC television transmission standard. Such specifications require that signals conform to numerous parameters, including limits on amplitude excursions. DSP systems which produce signals with undershoot or overshoot can violate such specifications by, for example, in NTSC video, making significant excursions into the blacker-than-black or whiter-than-white regions relative to the blanking level in response to an abrupt luma transition. Not only can this result in a video signal which violates the specifications of the NTSC standard, but it can also result in serious malfunctions in downstream systems that rely on adherence of signals to the specification.

Accordingly, to avoid ringing and undershoot/overshoot transients, it is usually necessary to employ filters having sufficiently gradual roll-off characteristics. This causes yet another problem, however, for systems which need to process input signals with an unknown origin. For example, a low-pass filter in a color video modulator may in some instances be processing signals which were produced by computer, while in other instances it may be processing signals which were produced by a video camera. Signals from the latter source usually have already been sufficiently filtered to avoid causing transient undershoot/overshoot problems, while computer-generated signals often have not. Thus if the filter is designed with a gradual enough roll-off to prevent transient undershoots and overshoots caused by the computer-generated input signal, such a filter would needlessly degrade performance in response to input signals which derive from a previously filtered source such as a video camera. On the other hand, if the filter is designed with a sharp frequency cutoff so as not to degrade the performance of the system in response to an already-filtered signal source, then the filter will fail to prevent the undershoot or overshoot which can be produced in response to a computer-generated signal source.

One possible solution to the transient undershoot/overshoot problem might be to design the filter using sharp frequency cutoffs, and then either "hard clip" signal excursions outside the compliance range or allow them to "fold over" back into the compliance range. A hard clip maintains the signal level at a fixed "clip" level, irrespective of the actual signal magnitude during the overshoot. However, while the hard clip technique causes only a minor time domain waveform distortion, it is rich in high amplitude harmonic content which can cause many undesirable aliasing and interference problems. The fold over technique produces a dramatically wrong level, with severe time domain waveform distortion and extreme harmonic contamination. Both of these alternatives are undesirable.

SUMMARY OF THE INVENTION

Accordingly, it is an object of the invention to ameliorate some or all of the above problems.

It is another object of the invention to provide a technique for implementing a digital filter which has a sharp frequency domain roll-off characteristic, yet does not violate a steady state defined compliance range.

According to the invention, roughly described, a digital filter transfer function is chosen whose frequency domain cutoff is as sharp as desired. The transfer function may also include high frequency peaking (amplitude boosting) if desired. The overall transfer function is then implemented using two (e.g.) implementing filters, one of which does not produce overshoot or undershoot but typically has inferior selectivity than that of the overall desired transfer function, and the other of which has a transfer function equal to the difference between the overall desired transfer function and the transfer function of the first implementing filter. That is, the sum of the transfer functions of the two implementing filters equals the transfer function of the desired filter. In typical operation, the output samples produced by the two separate filters are simply summed to provide an output sample reflective of the desired overall filter transfer function. Assuming the two implementing filters are temporally coordinated, the overall output samples will be the same as if the overall desired filter function were implemented conventionally. However, if the sum of an output sample from one of the implementing filters and the corresponding output sample from the other implementing filter falls outside predetermined minimum and maximum threshold limit values, then the output of the first implementing filter, instead of the summed output, is provided as the sample output of the overall filter. Since the transfer function of the first implementing filter by definition does not produce overshoot or undershoot, the overall filter switches to a characteristic transfer function which does not produce overshoot or undershoot for only the output samples which would otherwise fall outside the predetermined threshold limit values. Thus, undershoots and overshoots are prevented, while the filter transfer function is modified only when necessary.

The concept of implementing an overall desired filter characteristic using two or more implementing filters, and selecting one or a sum of the output samples produced by the implementing filters in response to the instantaneous amplitude of the sum, can be used in many digital filter applications, including those for which transient undershoot/overshoot is not a problem. For example, it can be used to pre-compensate for nonadaptive subsequent processing.

BRIEF DESCRIPTION OF THE DRAWINGS

The invention will be described with respect to particular embodiments thereof, and reference will be made to the drawings, in which like members are given like designations, and in which:

FIGS. 10A and 10B illustrate a block diagram of another implementation of the apparatus of FIG. 7.

DETAILED DESCRIPTION

In a general form, a digital filter transfer function can be described as $$H(z) = \frac{X(z)}{Y(z)} = \frac{\sum_{i=0}^{N_x-1} x_i z^{-i}}{\sum_{i=0}^{N_y-1} y_i z^{-i}}.$$

While the present invention can apply to filters having all types of transfer functions, the embodiments described herein all have transfer functions in which the denominator function Y(z) is unity. The general description of these filters is given by $$H(z) = \sum_{i=0}^{N-1} h_i z^{-i}.$$

Filters of this type can be guaranteed to avoid transient undershoot/overshoot problems if all of the coefficients $h_i$ are non-negative.

For consistency of nomenclature, when a filter characteristic is referred to herein, it is referred to by its Z-transform function. The function is represented as an upper case letter followed by the Z-transform variable in parentheses, e.g. H(z). For filters which can be expressed as a single polynomial in $z^{-i}$, the individual polynomial coefficients are represented by the lower-case version of the letter used to represent the transfer function, followed by a subscript, e.g. $h_i$. Individual time domain output samples of a filter are represented by the lower-case version of the letter used to represent the transfer function, followed by a lower-case 's' (for 'sample'), followed by a discreet time subscript t, e.g. $hs_t$.

Digital filters are usually implemented in such a way as to operate on an incoming stream of data samples, and to produce an outgoing stream of data samples. Parallel (or pseudo-parallel) implementations also exist in which an entire block of input samples is provided to the filter, which produces an entire block of output samples before beginning work on a new block of input samples, but the embodiments described herein use the continuous stream form. Various techniques for implementing digital filters of the continuous stream type are described in Rabiner and Gold, "Theory and Application of Digital Signal Processing" (Prentice-Hall: 1975), pp. 40–50, incorporated herein by reference.

Figure 1:
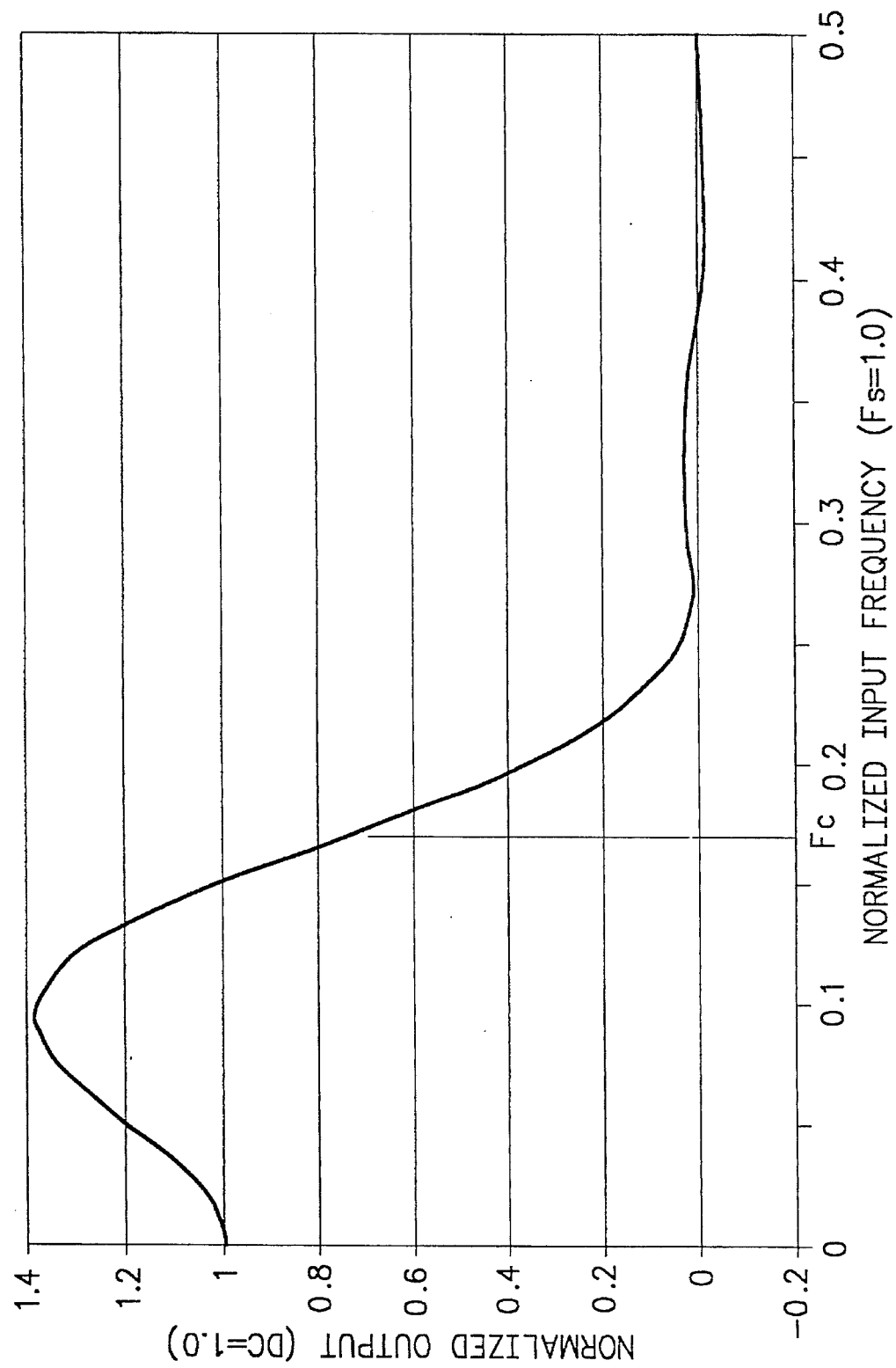
FIG. 1 is a computed plot of the transfer function of a desired filter which may be implemented using the present invention.

FIG. 1 is a frequency domain plot of the transfer function of a desired, low-pass filter having a transfer characteristic defined by $$S(z) = \sum_{i=0}^{N-1} s_i z^{-i},$$

where $N = 12$ and the $s_i$ are defined in the following table:

TABLE I

| | |
|---|---|
| $s_0$ | $-1/16$ |
| $s_1$ | $-3/16$ |
| $s_2$ | $-3/16$ |
| $s_3$ | $1/16$ |
| $s_4$ | $9/16$ |
| $s_5$ | $1$ |
| $s_6$ | $1$ |
| $s_7$ | $9/16$ |
| $s_8$ | $1/16$ |
| $s_9$ | $-3/16$ |
| $s_{10}$ | $-3/16$ |
| $s_{11}$ | $-1/16$ |

Since the coefficients in Table I are symmetrical about a center of symmetry half way between $s_5$ and $s_6$, the filter is known as a symmetrical filter. While the present invention is not limited to symmetrical filters, such filters are often advantageous since they provide a constant group delay.

Figure 2:
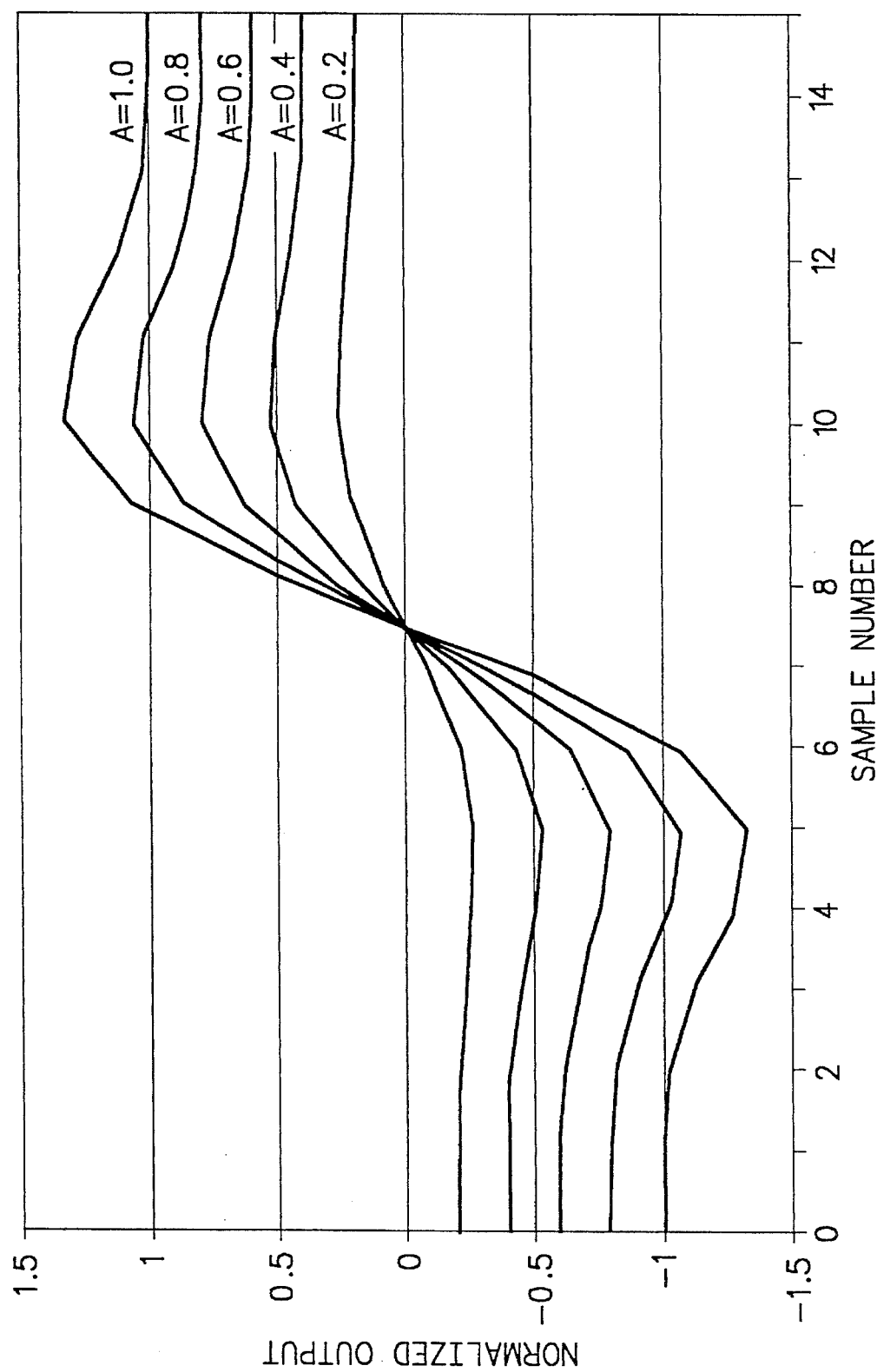
FIG. 2 is a computed time domain plot of a unit step response of the filter of FIG. 1.

As can be seen from FIG. 1, the filter has a cut-off frequency of $F_c \approx 0.17$ for a normalized input frequency for which $F_s = 1.0$. This particular filter may be desirable since its roll-off at the cut-off frequency is fairly sharp. The filter may also be desirable for some purposes since it includes some high frequency peaking. However, this filter also has a transient undershoot/overshoot problem. FIG. 2 is a time domain plot of the response of the above filter to an input signal which steps from $-A$ to $+A$ in two adjacent samples for several values of A in a normalized output range of $-1$ to $+1$. As can be seen, a significant amount of ringing can occur both before and after the transition in the output waveform, especially for larger values of A. This is also suggested by the fact that some of the coefficients $s_i$ are negative.

In order to minimize the transient undershoots and overshoots, yet maintain the sharp frequency domain roll-off of the filter, the overall filter function is implemented as two "implementing" filters U(z) and V(z), the outputs of which are added together. These implementing filters may be selected first by choosing a U(z), and then subtracting it from S(z) to determine V(z). As will be seen, U(z) is chosen preferably to have all non-negative coefficients in z. The design process may also be iterative, in which various selections are made for U(z) and the implementations for the resulting overall filters S(z) are compared to optimize hardware usage.

In the present embodiment, the implementing filters $$U(z) = \sum_{i=0}^{N-1} u_i z^{-i}$$

and $$V(z) = \sum_{i=0}^{N-1} v_i z^{-i}$$

are chosen as having the coefficients set forth in Table II. Table II also lists the sum of each $u_i$ and its corresponding $v_i$, and it can be seen that such sum is the same as the corresponding $s_i$ of the overall desired filter transfer function as listed in Table I.

TABLE II

| i | $u_i$ | $v_i$ | $u_i + v_i$ |
|---|---|---|---|
| 0 | 0 | $-1/16$ | $-1/16$ |
| 1 | $1/16$ | $-1/4$ | $-3/16$ |
| 2 | 0 | $-3/16$ | $-3/16$ |
| 3 | $1/16$ | 0 | $1/16$ |
| 4 | $1/16$ | $1/2$ | $9/16$ |
| 5 | 1 | 0 | 1 |
| 6 | 1 | 0 | 1 |
| 7 | $1/16$ | $1/2$ | $9/16$ |
| 8 | $1/16$ | 0 | $1/16$ |
| 9 | 0 | $-3/16$ | $-3/16$ |
| 10 | $1/16$ | $-1/4$ | $-3/16$ |
| 11 | 0 | $-1/16$ | $-1/16$ |

Figure 3:
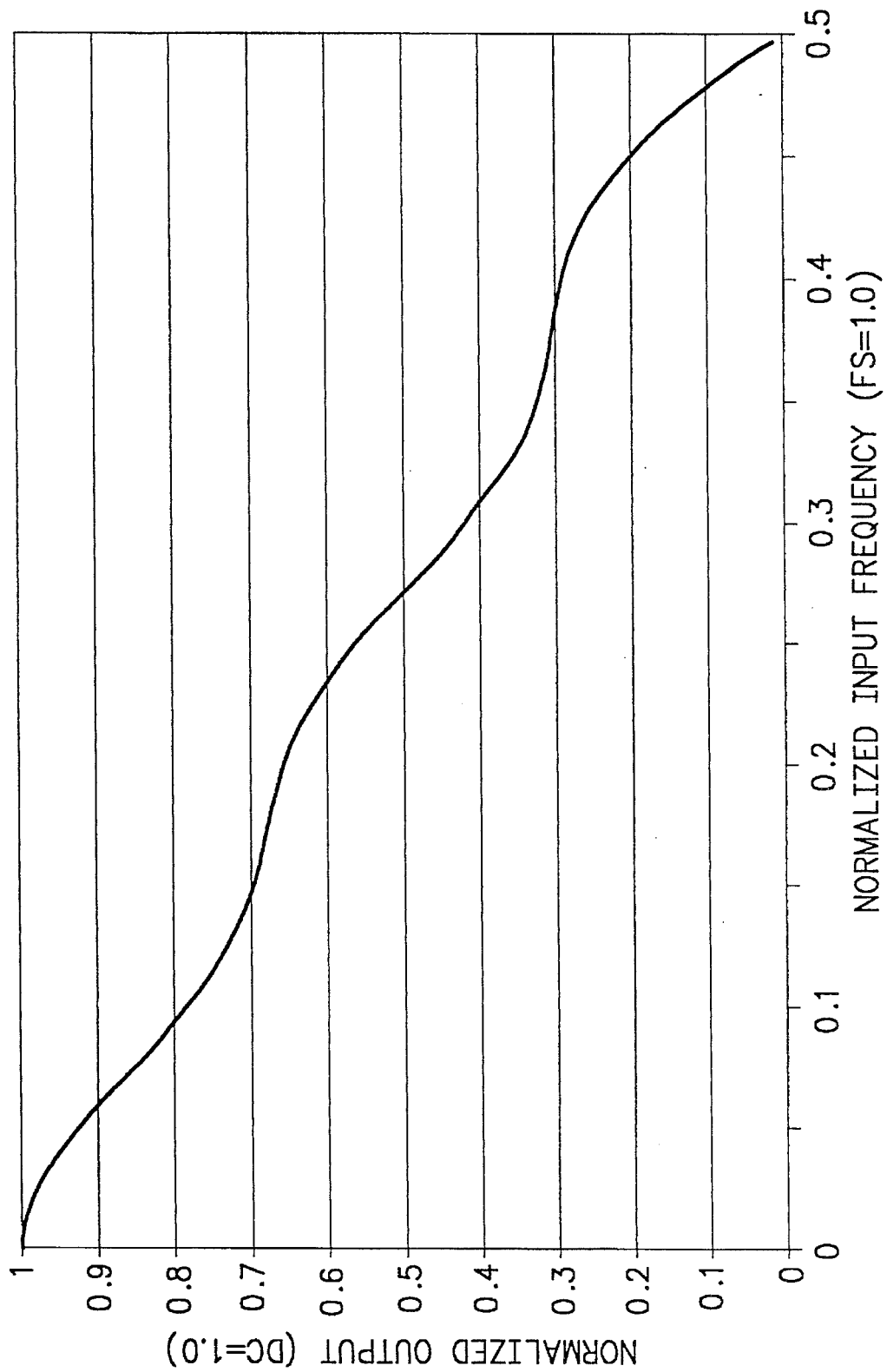
FIG. 3 is a computed frequency domain plot of the transfer function of a first implementing filter for implementing the filter defined by FIG. 1.
Figure 4:
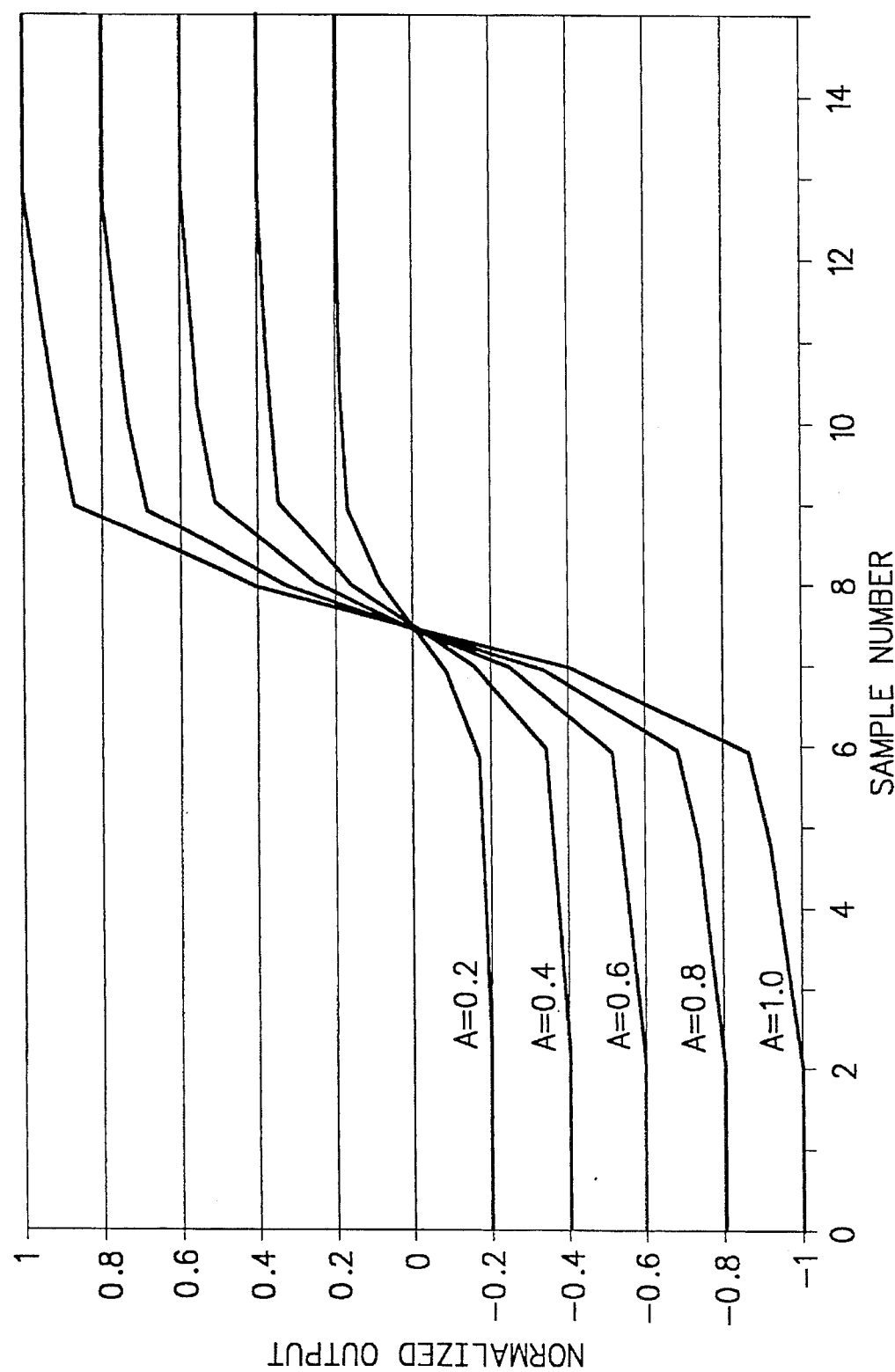
FIG. 4 is a computed time domain plot of the unit step function of the filter defined by FIG. 3.

FIG. 3 shows a frequency domain plot of the transfer function U(z) as defined above, and FIG. 4 shows the time domain-response of U(z) to the same input step transitions as used for FIG. 2. As can be seen from FIG. 3, the roll-off toward higher frequencies is rather gentle. As can be predicted from this characteristic, as well as from the fact that all the coefficients of U(z) are non-negative, the response of the filter U(z) to the input step transition avoids transient undershoot and overshoot. This can be seen in FIG. 4. However, significant information content has been undesirably suppressed at the higher frequencies of the pass band.

Figure 5:
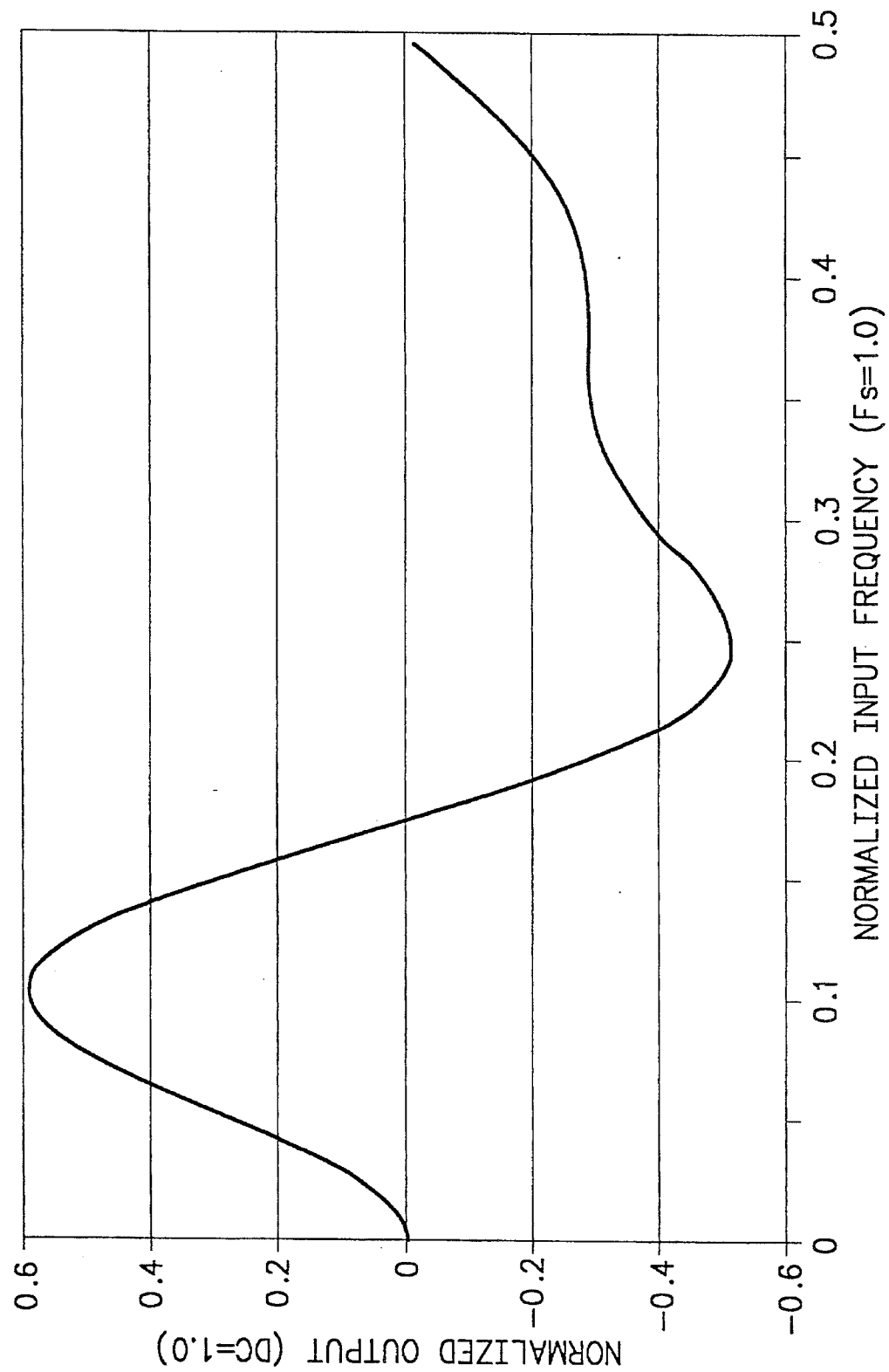
FIG. 5 is a computed frequency domain plot of the transfer characteristic of a second implementing filter for implementing the filter defined by FIG. 1.
Figure 6:
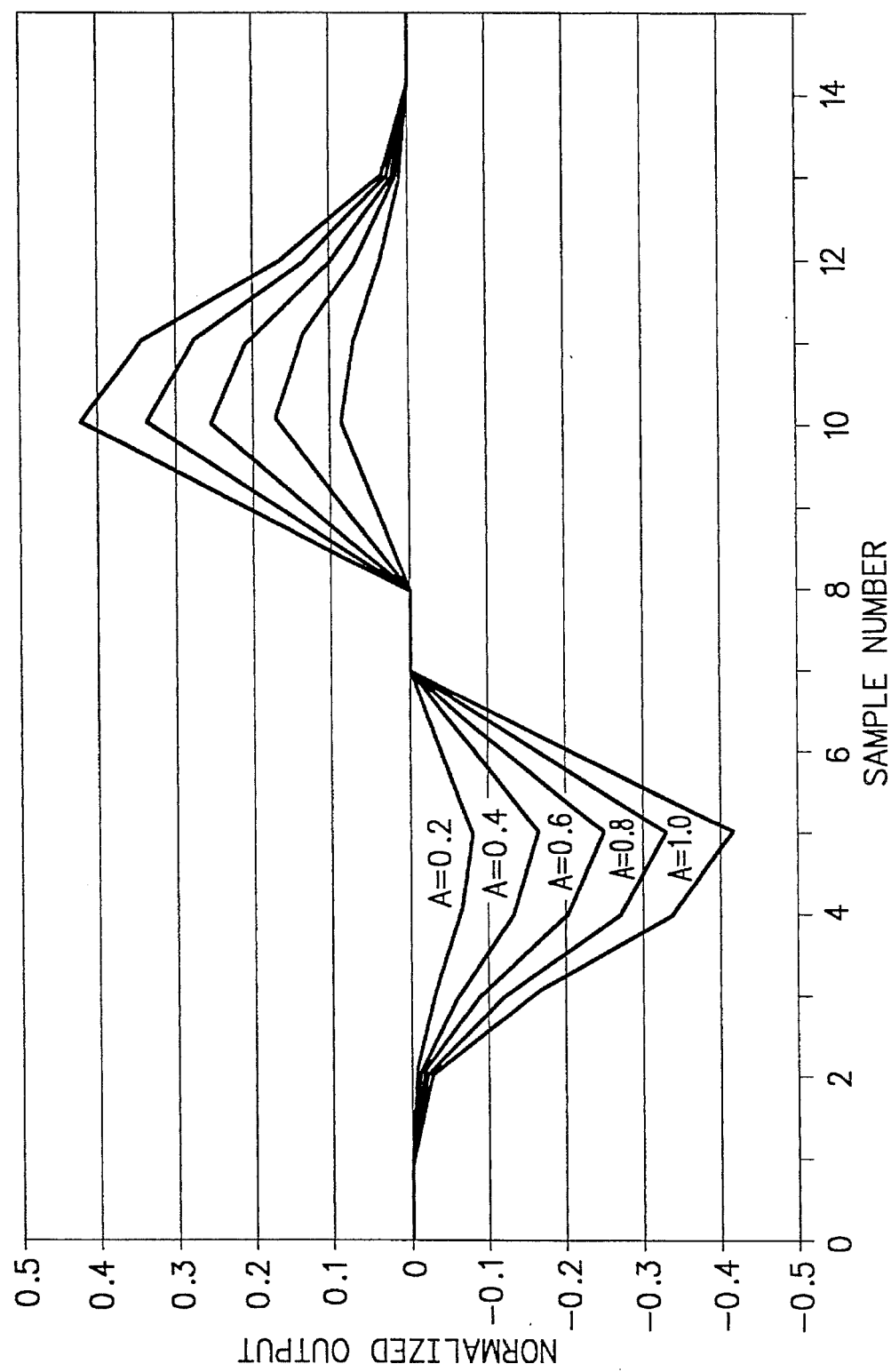
FIG. 6 illustrates the computed unit step response of the filter defined by FIG. 5.

FIG. 5 is a frequency domain plot of the transfer characteristic of the filter V(z), and FIG. 6 illustrates the time domain response of the filter V(z) to the same input step transitions as used for FIGS. 2 and 4.

Figure 7:
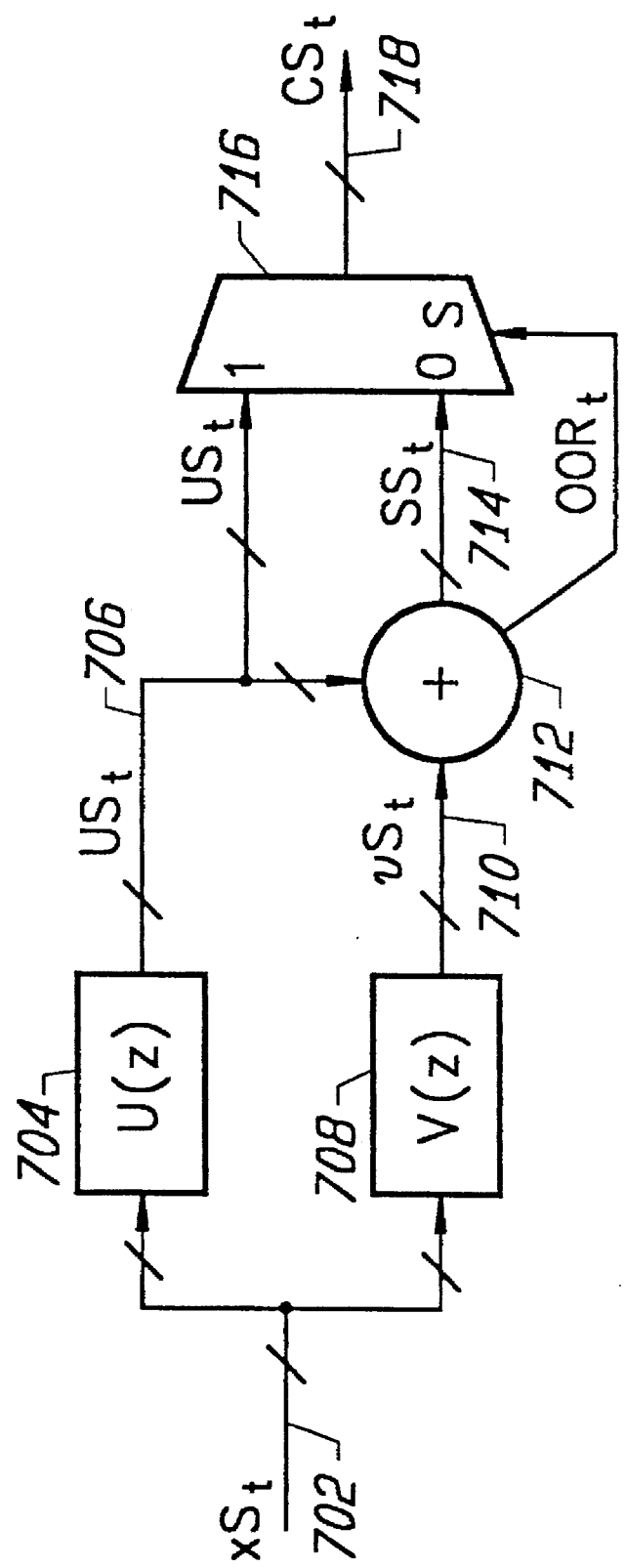
FIG. 7 is a block diagram of an overall filter incorporating the present invention.

FIG. 7 is a block diagram of an overall filter incorporating the present invention. It comprises an input bus 702 carrying a stream of input samples $xs_t$ for a series of discreet times t. The input bus 702 is provided as an input to a U(z) implementing filter 704, the output of which carries a stream of samples $us_t$ over a bus 706. The input bus 702 is also connected the input port of a V(z) implementing filter 708, the output of which provides a stream of samples $vs_t$ over a bus 710. The buses 706 and 710 are provided to respective inputs of an adder 712, the data output of which is provided over a bus 714 to the '0' input port of a multiplexer (data selector) 716. The samples provided on the bus 714 are designated $ss_t$ since, as set forth above, they represent the output of the desired filter S(z) which is being approximated in the present embodiment. The '1' input port of data selector 716 is connected to receive the $us_t$ samples from bus 706, and the output port of data selector 716 provides a stream of output samples $cs_t$ over an output bus 718. The adder 712 also determines whether the sum of each sample $us_t$ and its corresponding sample $vs_t$ is outside a predefined $cs_t$ compliance range, and if so, asserts an out-of-range $OOR_t$ signal provided to the select input of the data selector 716.

Note that the predefined $cs_t$ compliance range includes at least the $us_t$ compliance range of the filter U(z). The predefined $cs_t$ compliance range could be greater, allowing some overshoot and undershoot to pass. If the predefined $cs_t$ compliance range is smaller than the $us_t$ compliance range of filter U(z), then the system will switch to using only the filter U(z) output during non-overshoot and non-undershoot conditions which exceed the $cs_t$ compliance range.

The filters U(z) and V(z) are implemented so as to have identical group delay. Since both U(z) and V(z) are symmetrical FIR filters (see Table II), identical group delay is accomplished with hardware hereinafter described by enforcing that both implementing filters have the same effective point of impulse response symmetry.

In operation, as long as the sum of $us_t$ and $vs_t$ for each t is within the predefined range, $OOR_t$ remains unasserted and the data selector 716 selects $ss_t$ to the output to provide the combined output sample $cs_t$. For such sample times t, the filter of FIG. 7 performs identically to the desired filter S(z). Should transient undershoot/overshoot occur, however, and should such undershoot/overshoot either exceed the upper threshold limit of the predefined $cs_t$ compliance range or fall below the lower threshold limit of the predefined $cs_t$ compliance range, then adder 712 will assert $OOR_t$ for such sample t and data selector 716 will select $us_t$ to the output instead of selecting $ss_t$. In essence, therefore, the overall filter of FIG. 7 follows the more gentle roll-off characteristic of U(z) instead of S(z) only during times which would otherwise cause undershoot/overshoot.

Figure 9A:
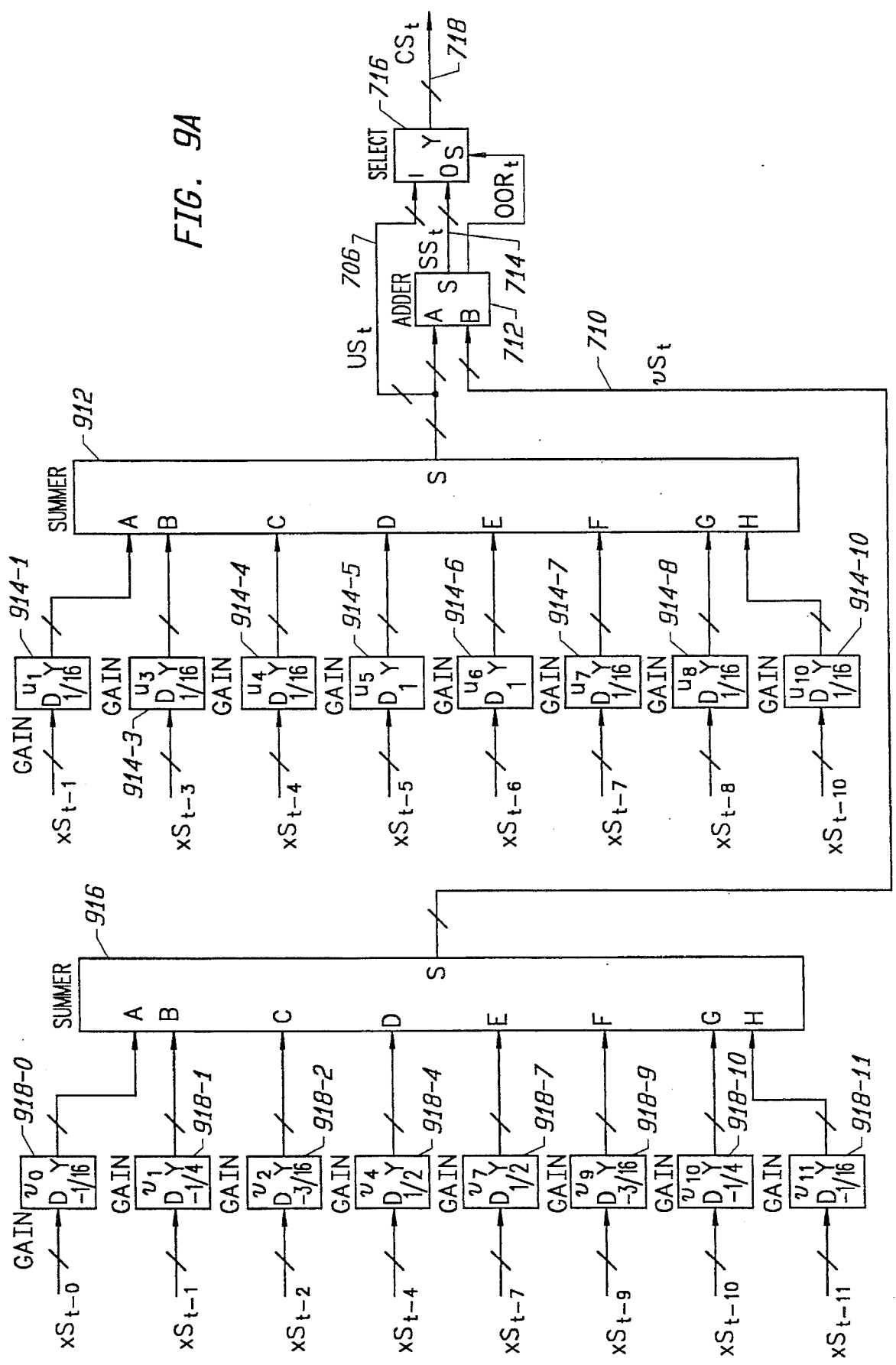
FIGS. 9A and 9B illustrate a block diagram of an implementation of the apparatus of FIG. 7.
Figure 9B:
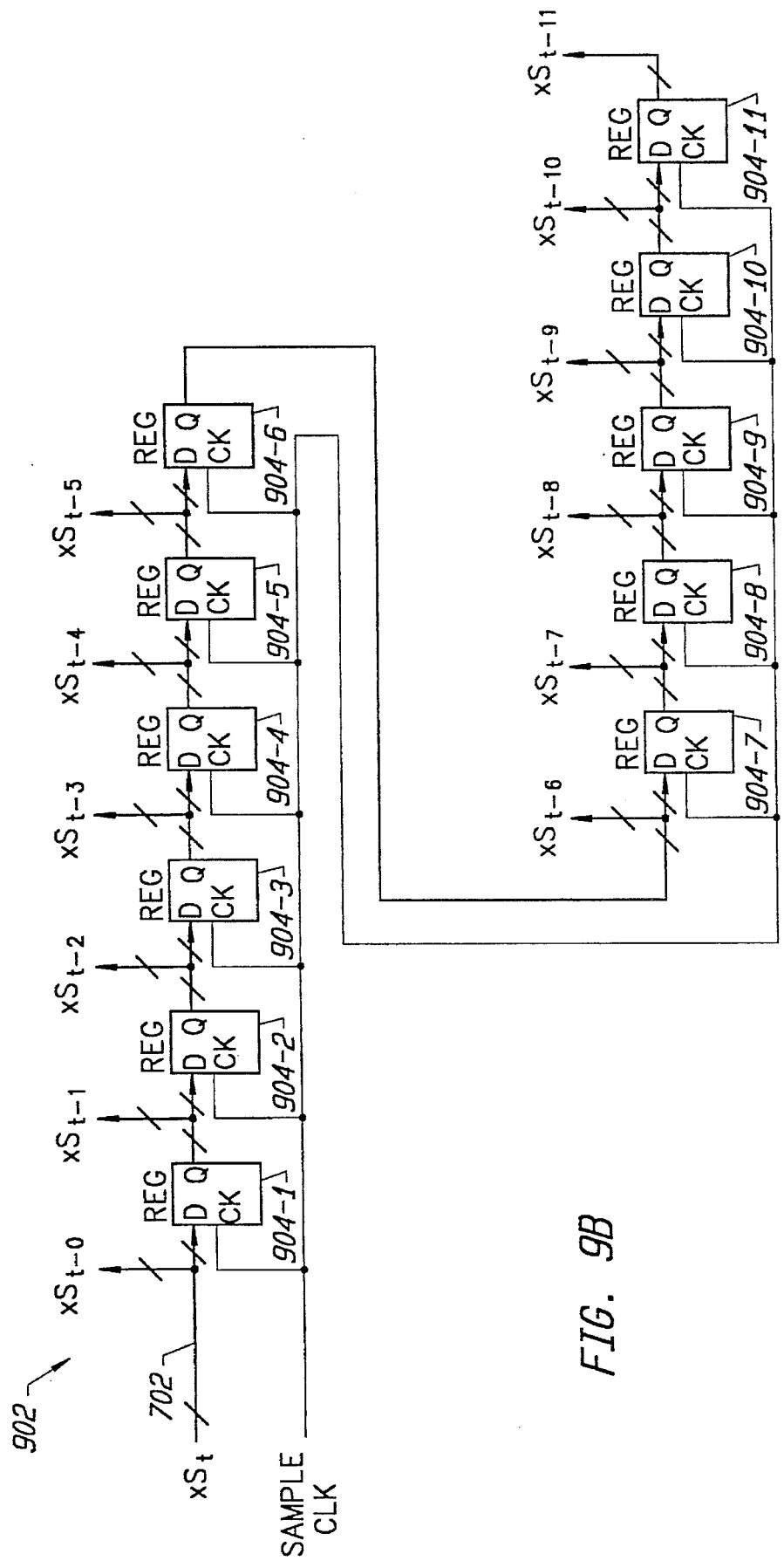

FIGS. 9A and 9B together illustrate a block diagram of an implementation of the apparatus of FIG. 7. A simplification is employed in which a single 12-tap delay line is shared by both implementing filters 704 and 708. Referring first to FIG. 9B, the input bus 702 (FIG. 7) is provided to the input of a 12-tap delay line 902. Within the delay line 902, the input bus 702 is connected to the D input of a register 904-1, the Q output of which is connected to the D input of a register 904-2, and so on to register 904-11. The clock inputs of the registers 904-1 through 904-11 (collectively 904) are all connected to receive the sample clock, such that at any time t, the output of each of the registers 904-j carries the value of sample $xs_{t-j}$, $1<j<11$. The input to register 904-1 carries $xs_{t-0}$. The outputs of the respective registers 904, together with the input to register 904-1, form the respective taps of delay line 902.

FIG. 9A shows the weighting and summing portions of implementing filters 704 and 708, as well as the adder 712 and data selector 716 (FIG. 7). In particular, to implement U(z), the apparatus of FIG. 9A includes a summer 912 having eight input ports A through H. The eight input ports of summer 912 correspond to the eight non-zero coefficients $u_i$ of the transfer function U(z). Accordingly, the input ports of summer 912 are coupled to receive the eight tap outputs $xs_{t-i}$ (FIG. 9B) which correspond to non-zero coefficients $u_i$, through respective gain stages 914-i (collectively 914). As can be seen, all of the non-zero coefficients $u_i$ are either unity or 1/16, and the gain stages 914 therefore can all be implemented merely as a fixed shifting of the bit lines from the tap outputs of delay line 902 to the summer 912 input ports. No actual hardware is required for these gain stages 914. Note that the choice of coefficients $u_i$ which can all be implemented by fixed shifting represents a compromise between good filter response characteristics and economy of manufacture. In a different embodiment, the designer might choose some $u_i$ which do require gain stage hardware in order to obtain better filter response characteristics.

Similarly to the implementing filter 704, the filter 708 is implemented using a summer 916 which also has input ports A-H corresponding to the eight non-zero coefficients $v_i$ of the transfer function V(z). These input ports are coupled to receive the respective taps $xs_{t-i}$ from the delay line 902, via respective gain stages 918-i (collectively 918). Some of the gain stages 918 require merely a shift of bit positions from the tap outputs of delay line 902 to the corresponding input ports of summer 916 (for example, gain stages 918-4 and 918-7), whereas others require negation and shifting (gain stages 918-0, 918-1, 918-10 and 918-11) and still others require negation and multiplication (gain stages 918-2 and 918-9). Those that require multiplication can be implemented sparsely using a two-input adder. Advantageously, all the negative coefficients can be implemented as positive gain stages followed by an intermediate summer, the output of which is subtracted from a sum of the outputs of the gain stages of one or more of the positive coefficients. Also, where possible, tap gains can be effected after summing full amplitude signals so as to minimize truncation errors. Many other possible variations will be apparent.

The output port of summer 912 carries the samples $us_t$ over bus 706 both to the A input port of adder 712 and to the '1' input port of data selector 716. The output of summer 916 provides the $vs_t$ samples over bus 710, to the B input port of adder 712. The adder 712 sums each sample $us_t$ with its corresponding sample $vs_t$ to produce a sum sample $ss_t$ over bus 714, which is provided to the '0' input of data selector 716.

The $OOR_t$ signal is generated by circuitry within the adder 712, to assert $OOR_t$ whenever the sum $us_t+vs_t$ is outside a predetermined range. In the present embodiment, the predetermined range is advantageously chosen to be the full range which can be expressed using the bit width of adder output bus 714 (carry-out excepted). In the present embodiment, that width is the same as the width of buses 706 and 718, which is 9 bits. (Bus 710 is 10 bits wide.) Conveniently, therefore, the circuitry to generate $OOR_t$ is the same as circuitry which conventionally generates an overflow/underflow signal for an adder. The logic function to produce $OOR_t$ is $$OOR_t = [SB(us_t) \oplus SB(ss_t)] \cdot \overline{[SB(us_t) \oplus SB(vs_t)]},$$

where SB(x) indicates the sign bit of the value x.

The $OOR_t$ signal is provided to the select input of data selector 716, and the output port of data selector 716 carries the combined (selected) samples $us_t$ or $ss_t$ as samples $cs_t$ on output bus 718. Note that the circuit complexity for implementing S(z) using the technique described herein is comparable to that of implementing S(z) directly, provided that each $u_i$ is zero when the corresponding $v_i$ is non-zero, and vice versa.

Figure 8:
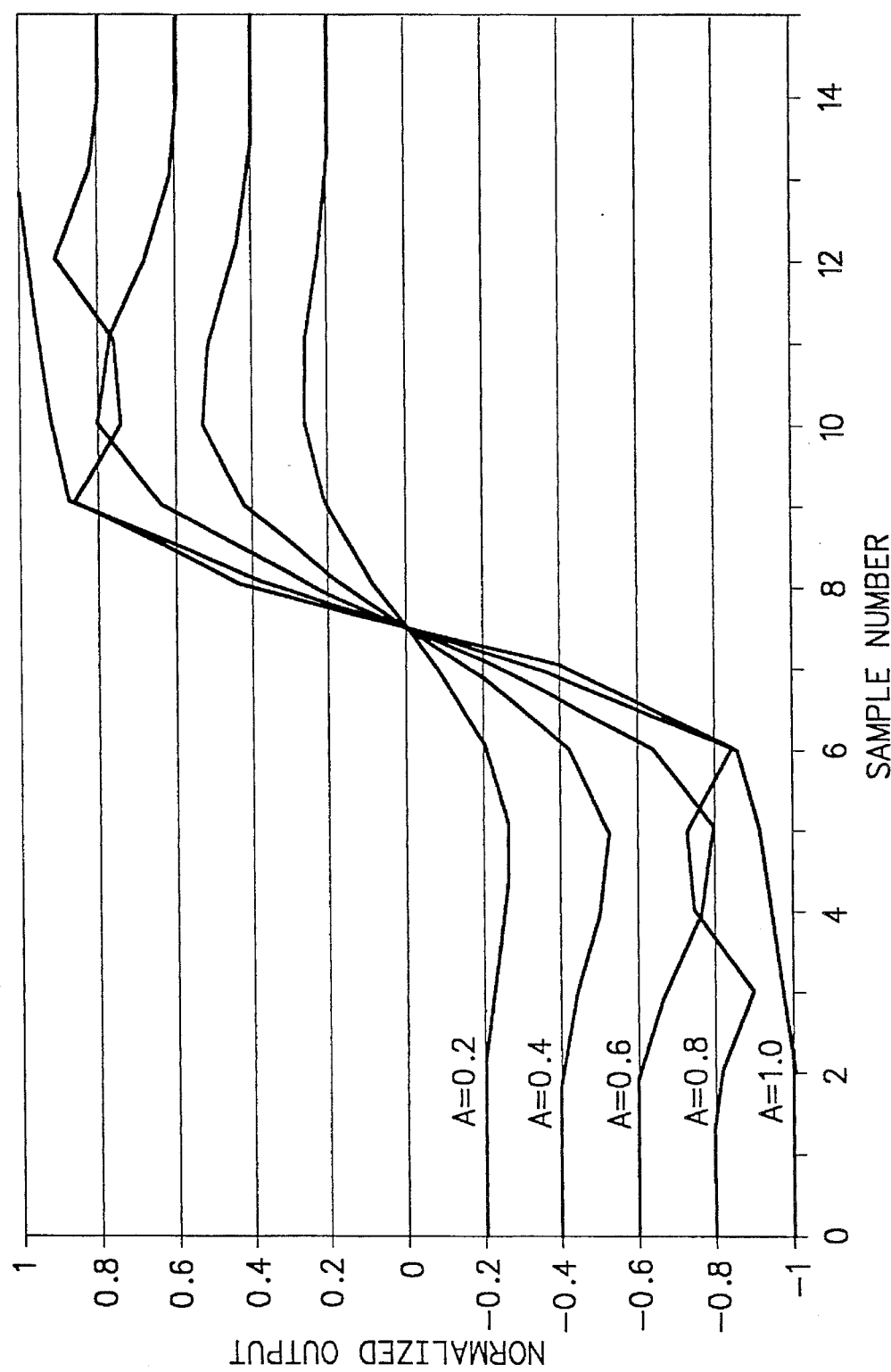
FIG. 8 illustrates the computed unit step response of a possible filter constructed in accordance with FIG. 7.

FIG. 8 illustrates the time domain response to the same input step transitions as used for FIGS. 2, 4 and 6, of a filter constructed in accordance with FIGS. 9A and 9B. As can be seen, the rise time of the combined output samples $cs_t$ indicates little loss of information content in the higher frequencies of the pass band, yet the transient undershoot/overshoot of the $cs_t$ samples remains within the predefined $cs_t$ compliance range. Note that the ringing characteristics of S(z) are not modified if the predefined $cs_t$ compliance range is not violated.

Accordingly, the filter of FIG. 7 approximates S(z) without requiring additional bits of data encoding precision to be carried through all downstream DSP processing, including a final DAC. Additionally, since such a DAC can be designed with compliance range limits defined by steady-state levels rather than transient undershoot/overshoot levels, the DAC can be designed with significantly lower precision than would otherwise be required. The full output voltage range of the DAC can also be fully utilized by the steady-state signal, thereby minimizing the SNR of the resulting signal. All output signal excursions can also be limited to remain within a "safe zone" defined by standard specifications to which the signal is required to adhere.

Further, the apparatus of FIG. 7 will process prefiltered signals without significant further degradation at the higher frequencies of the pass band, while also applying low-pass filtering should the source not have been pre-filtered. This is because a pre-filtered input signal will, due to its low slew rate, rarely if ever cause the data selector 716 to select to $us_t$, rather than a $ss_t$, thus making the filter characteristic of the overall apparatus of FIG. 7 substantially the same as the desired S(z) filter characteristic. On the other hand, if the signal has not been pre-filtered, then data selector 716 will select $us_t$ as required in order to maintain the transient undershoot and overshoot within the predefined range.

FIGS. 10A and 10B together form a block diagram of another filter using concepts of the present invention. As with the implementation of FIGS. 9A and 9B, the design of FIGS. 10A and 10B approximate a desired filter having a transfer function $$S(z) = \sum_{i=0}^{N-1} s_i z^{-i},$$

using two implementing filters having transfer function $$U(z) = \sum_{i=0}^{N-1} u_i z^{-i}$$

and $$V(z) = \sum_{i=0}^{N-1} v_i z^{-i}$$

For the purposes of FIGS. 10A and 10B, the transfer function coefficients are as set out in Table III.

TABLE III

| i | $u_i$ | $v_i$ | $s_i = u_i + v_i$ |
|---|---|---|---|
| 0 | 0 | −¼ | −¼ |
| 1 | 3/32 | 0 | 3/32 |
| 2 | ½ | ½ | 1 |
| 3 | 3/32 | 0 | 3/32 |
| 4 | 0 | −¼ | −¼ |

This filter has a relatively sharp cutoff, and also incorporates peaking in the higher frequencies of the pass band. The filter is used after a sample doubler implemented with 3-point linear interpolation. The peaking characteristic of the filter both post-compensates for the reduction of high frequency information content caused by the interpolator, and also pre-compensates for the (sin x)/x roll-off characteristic of a downstream D/A convertor.

Referring to FIG. 10B, a single five-tap delay line 1002 is shared by both implementing filters 1024 and 1028. The input bus is provided to the input of the delay line 1002, and the sample shown entering the delay line 1002 on bus 1022 is designated $xs_t$.

Within the delay line 1002, the input bus 1022 is connected to the D input of a register 1004-1, the Q output of which is connected to the D input of a register 1004-2, and so on to register 1004-4. The clock inputs of the registers 1004-1 through 1004-4 (collectively, 1004) are all connected to receive the sample clock, such that at any time t, the output of each of the registers 1004-j carries the value of sample $xs_{t-j}$, 1<j<4. The input to register 1004-1 carries $xs_{t-0}$. These buses form the respective taps of delay line 1002.

FIG. 10A shows weighting and summing portions of implementing filters 1024 and 1028, as well as the adder 1032 and the data selector 1036. In particular, to implement U(z), the apparatus of FIG. 10A includes a summer 1012 having three input ports A, B and C. The three input ports of summer 1012 correspond to the three non-zero coefficients $u_i$ of the transfer function U(z) as defined in Table III. Accordingly, the input ports of summer 1012 are coupled to receive the three tap outputs $xs_{t-i}$ (FIG. 10B) which correspond to the non-zero coefficients $u_i$ in Table III, through respective gain stages 1014-i (collectively, 1014). The gain stages 1014-1 and 1014-3 each multiply their input sample values by 3/32, and gain stage 1014-2 multiplies its thus be implemented by summing the full-scale signals $xs_{t-1}$ input value by ½. Gain stages 1014-1 and 1014-3 can and $xs_{t-3}$ to produce an intermediate sum, followed by another adder which sums 1/32 of the intermediate sum with 1/16 of the intermediate sum. The divisions by 32 and by 16 are each implemented by hard-wired right-shifts of the bit lines. Similarly, gain stage 1014-2 can be implemented merely as a fixed right-shift, by one bit, of the bit lines carrying $xs_{t-2}$. No actual hardware is required for gain stage 1014-2.

The filter 1028 in FIG. 10A is implemented using a summer 1016 which also has input ports A, B and C corresponding to the three non-zero coefficients $v_i$ of the transfer function V(z) as defined in Table III. These input ports are coupled to receive the respective taps $xs_{t-i}$ from the delay line 1002, via respective gain stages 1018-i (collectively, 1018). Of these gain stages, gain stage 1018-2 is implemented merely as a one-bit, right-shift of the bit lines carrying $xs_{t-2}$, whereas gain stages 1018-0 and 1018-4 each require negation and shifting. As with the embodiment of FIGS. 9A and 9B, various topologies are possible to implement the "addition of one", which is part of the negation function performed by gain stages 1018-0 and 1018-4.

The output port of summer 1012 carries the samples $us_t$ over bus 1026 both to the A input port of adder 1032 and to the '1' input port of data selector 1036. The output of summer 1016 provides the $vs_t$ samples over bus 1030, to the B input port of adder 1032. The adder 1032 sums each sample $us_t$ with its corresponding sample $vs_t$ to produce a sum sample $ss_t$ over bus 1034 to the '0' input of data selector 1036. The $OOR_t$ signal is produced by adder 1032 in the same manner that it is produced by the adder 1032 in the embodiment of FIG. 9A, but in the embodiment of FIG. 10A, $OOR_t$ is ORed with an adaptive operation inhibit signal, by an OR gate 1020, before it is provided to the select input of data selector 1036. When the adaptive operation inhibit signal is asserted, the overall filter of FIGS. 10A and 10B always reflects the transfer function U(z). The output port of data selector 1036 carries the combined (selected) samples $us_t$ or $ss_t$, as samples $cs_t$, on output bus 1038.

In both of the examples of FIGS. 9A/9B and FIGS. 10A/10B, the overall desired filter transfer function is symmetrical and the two implementing filters also have transfer functions which are symmetrical. Thus, like the overall desired transfer function, each of the implementing filters in each of the two embodiments also exhibit constant group delay. The group delays of both implementing filters are moreover guaranteed to be equal since they share the same point of symmetry on the delay line. It may be appropriate for some purposes to design a filter which does not have constant group delay, for example to pre- or post-compensate for group delay distortion introduced by another cascaded element. When such a filter is divided into two implementing filters as in the present invention, it is still desirable that the group delays of the two implementing filters be the same.

Several variations of embodiments of the invention are possible. For example, in one variation, an overall desired transfer function $S(z)$ may be implemented using three implementing filters $U(z)$, $V(z)$ and $W(z)$ instead of two. In this embodiment, $U(z)$ might be selected to have all positive coefficients, and $V(z)$ might be selected to have all positive coefficients except for some portion of the negative coefficients in $S(z)$. $W(z)$ would be selected as the difference between $S(z)$ and the sum of $U(z)$ and $V(z)$. Logic might then be employed to select between the following four options to derive each output sample $cs_t$, optimizing the choice according to predefined goals:

1. $cs_t = us_t$
2. $cs_t = us_t + vs_t$
3. $cs_t = us_t + ws_t$
4. $cs_t = us_t + vs_t + ws_t$

The logic would consider the instantaneous values of the four options in making its selection, and might also consider historical sample values in order to determine a selection. Accordingly, the invention is not limited to implementation using exactly two implementing filters.

In another variation, the output samples from one or more of the implementing filters might be selectably attenuated before being added to the others. For example, where two implementing filters $U(z)$ and $V(z)$ are used, the output selection might be made between the following four options:

1. $cs_i = us_i$;
2. $cs_i = us_i + vs_i/4$;
3. $cs_i = us_i + vs_i/2$; and
4. $cs_i = us_i + vs_i$.

The available attenuation factors are advantageously chosen to be integer powers of 2 in order to optimize the implementation, but it will be understood that other attenuation factors can be provided instead.

As previously mentioned, one methodology for designing a filter according to the invention is to first select an overall desired filter transfer characteristic $S(z)$, then choose a $U(z)$ and subtract it from $S(z)$ to determine $V(z)$. Different choices may be made for $U(z)$, and the hardware required to implement the overall filter resulting from each choice of $U(z)$ may be compared in order to optimize hardware usage. In another methodology, the designer can essentially decouple the design of the higher-frequency portion of $S(z)$ from the design of the lower-frequency portion of $S(z)$. In particular, it is worthwhile noting from FIG. 5 that the filter $V(z)$ is a band-pass filter. This can also be seen from the fact that the sum of all the coefficients $v_i$ in Table II is zero. While not essential to the invention, it can be advantageous for certain types of overall filter transfer functions to begin the design process with this constraint on $V(z)$ since it permits the designer to control the characteristics of the higher frequency parts of the passband largely independently of the lower frequency parts of the passband. That is, if the designer adheres to a constraint that all the coefficients of $U(z)$ are non-negative, and also adheres to a constraint that the sum of all the $v_i$ is zero, then the designer can adjust the steepness of the roll-off at the higher passband frequencies as desired merely by adjusting the coefficients of $V(z)$. The designer can also implement high frequency peaking in $V(z)$ if desired, by overcompensating in $V(z)$ for the gradualness of the high frequency roll-off of $U(z)$.

Still a third methodology for designing a filter according to the invention is to begin with desired transfer functions $S(z)$ and $U(z)$ and calculate $V(z)$ therefrom. The designer would then design hardware to implement the filter using $U(z)$ and $V(z)$. The hardware implementation would then be simplified as much as possible, iteratively, while maintaining functionally adequate resulting filter functions $S(z)$ and $U(z)$.

The foregoing description of embodiments and variations of the present invention has been provided for the purposes of illustration and description. It is not intended to be exhaustive or to limit the invention to the precise forms disclosed. Many further modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular uses contemplated. It is intended that the scope of the invention be defined by the following claims and their equivalents.

I claim:

1. Digital filter apparatus for use with a plurality of input samples, comprising:

a plurality of implementing filters, each coupled to receive said input samples and each of which produces a respective plurality of output samples, each t'th output sample in the plurality produced by any one of said implementing filters corresponding to a respective t'th output sample in the plurality produced by any other of said implementing filters; and combining circuitry coupled to receive said output samples of said implementing filters, and which produces a plurality of combined output samples, each t'th combined output sample being selectably one of a plurality of functions of the t'th output samples of said implementing filters, a first one of said functions producing said t'th combined output sample as the sum of the t'th output samples of at least a first and a second one of said implementing filters.

2. Apparatus according to claim 1, wherein said first function produces said t'th combined output sample as the sum of the t'th output samples of all of said implementing filters.

3. Apparatus according to claim 1, wherein a second one of said functions derives said t'th combined output sample from the t'th output sample of only said first implementing filter.

4. Apparatus according to claim 1, wherein a second one of said functions produces said t'th combined output sample as being equal to the t'th output sample of said first implementing filter.

5. Apparatus according to claim 4, for use further with predefined input signal compliance rules and a predefined output signal compliance range, wherein said first implementing filter has a transfer characteristic which precludes said first implementing filter from producing any output samples outside said output signal compliance range as long as said plurality of input samples satisfies said input signal compliance rules.

6. Apparatus according to claim 4, wherein said first implementing filter has a transfer characteristic which can be expressed as a polynomial in $z^{-i}$ having all non-negative coefficients.

7. Apparatus according to claim 1, wherein a third one of said functions produces said t'th combined output sample as the sum of the t'th output sample of said first implementing filter and a factor p times the t'th output sample of said second implementing filter.

8. Apparatus according to claim 7, wherein p is fixed.

9. Apparatus according to claim 7, wherein p is an integer power of 2.

10. Apparatus according to claim 7, wherein p is selectable among at least two integer powers of 2.

11. Apparatus according to claim 1, wherein said combining circuitry selects said one of said plurality of functions in dependence upon the amplitudes of the t'th output samples of said first and second implementing filters.

12. Apparatus according to claim 1, wherein said combining circuitry selects a second one of said functions different from said first one of said functions if said sum is outside a predetermined range.

13. Apparatus according to claim 12, wherein said second one of said functions produces said t'th combined output sample as being equal to the t'th output sample of said first implementing filter.

14. Apparatus according to claim 1, wherein all of said implementing filters exhibit the same group delay.

15. Apparatus according to claim 14, wherein said group delay is constant.

16. Apparatus according to claim 1, wherein all of said implementing filters are of the continuous stream type.

17. Digital filter apparatus for use with a plurality of input samples, comprising:

a first filter that produces a first plurality of output samples in accordance with a first transfer function of said input samples;

a second filter that produces a second plurality of output samples in accordance with a second transfer function of said input samples, each sample in said second plurality of output samples corresponding to a respective sample in said first plurality of output samples; and means for providing a plurality of filter output samples, each sample in said plurality of filter output samples being equal to a sum of a respective sample in said first plurality of output samples and the corresponding sample in said second plurality of output samples if said sum is within a predetermined range, and being equal to said respective sample in said first plurality of output samples if said sum is outside said predetermined range.

18. Digital filter apparatus for use with an input sample stream, comprising:

a first filter having an input coupled to receive said input sample stream, said first filter producing a first output sample stream having samples $us_t$;

a second filter having an input coupled to receive said input sample stream, said second filter producing a second output sample stream having samples $vs_t$, each sample in said second output sample stream corresponding to a respective sample in said first output sample stream; and output providing means for producing a filter output sample stream, each t'th sample of which corresponds to a respective sample in said first output sample stream and to a respective sample in said second output sample stream, and each t'th sample of which is either $us_t$ or $us_t + vs_t$, selectably in dependence upon said corresponding samples $us_t$ and $vs_t$ in said first and second output sample streams.

19. Apparatus according to claim 18, wherein said first filter has a transfer function defined by $$U(z) = \sum_{i=0}^{N_u-1} u_i z^{-i},$$

where $N_u > 0$ and at least one of said $u_i$ is non-zero; and wherein said second filter has a transfer function defined by $$V(z) = \sum_{i=0}^{N_v-1} v_i z^{-i},$$

where $N_v > 0$ and at least one of said $v_i$ is non-zero.

20. Apparatus according to claim 19, wherein said first and second filters exhibit equal group delay.

21. Apparatus according to claim 20, wherein said group delay is constant.

22. Apparatus according to claim 19, wherein all of said $u_i$ are non-negative.

23. Apparatus according to claim 22, wherein at least one of the coefficients in $z^{-i}$ of a combined transfer function defined by $$S(z) = U(z) + V(z)$$

is negative.

24. Apparatus according to claim 19, wherein said first and second filters exhibit equal group delay, wherein all of said $u_i$ are non-negative, wherein at least one of the coefficients in $z^{-i}$ of a combined transfer function defined by $$S(z) = U(z) + V(z)$$

is negative, and wherein said output providing means produces each t'th sample of said filter output stream as $us_t + vs_t$ if $us_t + vs_t$ is within a predetermined range, and as $us_t$ if $us_t + vs_t$ is outside said predetermined range.

25. Apparatus according to claim 19, wherein said first filter comprises:

a delay line having an input port coupled to receive said input sample stream and having a tap corresponding to each of said $u_i$ which is non-zero and a tap corresponding to each of said $v_i$ which is non-zero; and a first summer having an input port for each of said $u_i$ which is non-zero, each i'th one of said input ports of said first summer being coupled to receive the i'th one of said taps weighted by the respective $u_i$, said first summer having an output coupled to provide said first output sample stream, and wherein said second filter comprises said delay line; and a second summer having an input port for each of said $v_i$ which is non-zero, each j'th one of said input ports of said second summer being coupled to receive the j'th one of said taps weighted by the respective $v_j$, said second summer having an output coupled to provide said second output sample stream.

26. Digital filter apparatus for use with an input sample bus, comprising:

a first filter having an input coupled to said input sample bus and further having an output, said first filter having a transfer function defined by $$U(z) = \sum_{i=0}^{N-1} u_i z^{-i},$$

where N>0, all of said $u_i$ are non-negative and at least one of said $u_i$ is also non-zero;

a second filter having an input coupled to said input sample bus and further having an output, said second filter having a transfer function defined by $$V(z) = \sum_{i=0}^{N-1} v_i z^{-i},$$

where at least one of said $v_i$ is non-zero, V(z) being such that at least one coefficient in $z^{-i}$ of a combined transfer function defined by $$S(z)=U(z)+V(z)$$

is negative, said second filter having the same group delay characteristic as said first filter;

an adder having a first input coupled to said output of said first filter and a second input coupled to said output of said second filter, said adder further having an output;

a threshold detector having an out-of-range output and asserting said out-of-range output if said sum of the values on said output of said first filter and said output of said second filter is outside a predetermined range; and a data selector having a first data selector input port coupled to said output of said first filter, a second data selector input port coupled to said output of said adder, and a select input coupled to said out-of-range output of said threshold detector, said data selector further having a data selector output and selecting said first data selector input port to said data selector output if said select input is asserted, and selecting said second data selector input port to said data selector output if said select input is unasserted.

27. Apparatus according to claim 26, wherein said first filter comprises:

a delay line having a plurality of taps including taps corresponding to each of said coefficients $u_i$ which is non-zero; and a summer having a plurality of input ports coupled to respective ones of said taps with weights defined by respective ones of said $u_i$'s, and wherein said second filter comprises:

said delay line, said taps of said delay line also including taps corresponding to each of said coefficients $v_i$ which is non-zero; and a summer having a plurality of input ports coupled to respective ones of said taps with weights defined by respective ones of said $v_i$'s.

28. Apparatus according to claim 26, wherein said adder further has an overflow/underflow output and said threshold detector comprises said adder, said out-of-range output of said threshold detector being said overflow/underflow output of said adder.

29. A method for designing a digital filter approximating a desired transfer function defined by $$S(z) = \sum_{i=0}^{N-1} s_i z^{-i},$$

where at least one of said $s_i$ is negative, comprising the steps of:

designing a first filter having a transfer function defined by $$U(z) = \sum_{i=0}^{N-1} u_i z^{-i},$$

where all of said $u_i$ are non-negative and at least one of said $u_i$ is also non-zero;

designing a second filter having a transfer function defined by $$V(z)=C(z)-U(Z); \text{ and}$$

designing a circuit which provides to an output, for each given sample output from said first filter, (1) the sum of said given sample output from said first filter and a corresponding sample output from said second filter, if said sum is within a predetermined range, and (2) said given sample output from said first filter if said sum is outside said predetermined range.

\* \* \* \* \*